(12) United States Patent
Furuta et al.

(10) Patent No.: US 6,423,978 B1
(45) Date of Patent: Jul. 23, 2002

(54) SYSTEM FOR DETECTING DISK-SHAPED OBJECT SUCH AS SEMICONDUCTOR WAFER OR MAGNETIC DISK

(75) Inventors: Naofumi Furuta; Sadao Noda, both of Tokyo (JP)

(73) Assignee: Sunx Limited, Aichi (JP)

( * ) Notice: Subject to any disclaimer, the term of this patent is extended or adjusted under 35 U.S.C. 154(b) by 0 days.

(21) Appl. No.: 09/492,186

(22) Filed: Jan. 27, 2000

(30) Foreign Application Priority Data

Jul. 16, 1999 (JP) .......................................... 11-203794
Dec. 10, 1999 (JP) .......................................... 11-351641

(51) Int. Cl.[7] .............................................. G01N 21/86
(52) U.S. Cl. .............................. 250/559.36; 250/559.4; 250/559.29; 414/938
(58) Field of Search ........................ 250/559.29, 559.3, 250/559.36, 559.37, 559.45, 559.46, 221; 414/936, 937, 938, 939, 940; 356/601, 602, 614, 615

(56) References Cited

U.S. PATENT DOCUMENTS

| | | | |
|---|---|---|---|
| 5,504,345 A | 4/1996 | Bartunek et al. | 250/559.4 |
| 6,013,920 A * | 1/2000 | Gordon et al. | 250/559.36 |
| 6,147,356 A * | 11/2000 | Hahn et al. | 250/559.29 |

FOREIGN PATENT DOCUMENTS

| | | |
|---|---|---|
| JP | 63-299245 | 12/1988 |
| JP | 1-167608 | 7/1989 |
| JP | 5-38761 | 5/1993 |
| JP | 6-70240 | 9/1994 |
| JP | 9-260466 | 10/1997 |
| JP | 11-145256 | 5/1999 |

* cited by examiner

Primary Examiner—Kevin Pyo
(74) Attorney, Agent, or Firm—Wenderoth, Lind & Ponack, L.L.P.

(57) ABSTRACT

A disk-shaped object detecting system detecting the presence or absence and position of a disk-shaped object such as semiconductor wafers or magnetic disks includes a light emitting element emitting light toward a circumferential edge of the object while being moved across the object, a light receiving element receiving the light reflected on the circumferential edge of the object while being moved across the object together with the light emitting element, delivering first and second light signals each according to the received light, the first and second light signals having a ratio depending upon at what position between opposite ends the light receiving element receives the light reflected on the circumferential edge of the object, the first and second signals having a magnitude relation which is reversed when the light reflected on the circumferential edge of the object has been moved from one end side to the other end side of the light receiving element, an AND processing section supplied with the first and second light signals delivered from the light receiving element and delivering either one of the light signals having a smaller magnitude than the other as an output thereof, and a determining section determining whether the output of the AND processing section has exceeded a predetermined level.

14 Claims, 11 Drawing Sheets

FIG. 5
(A) 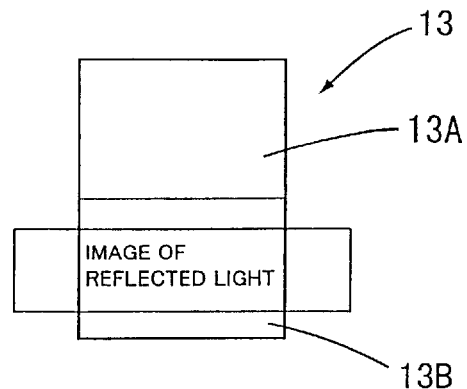
(B) 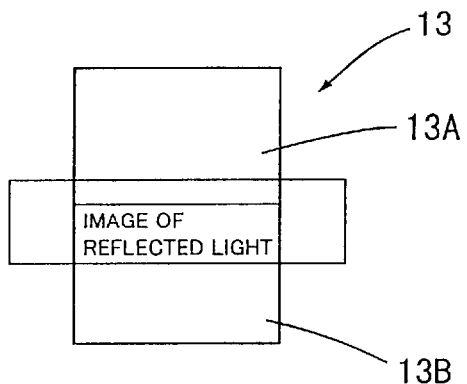
(C) 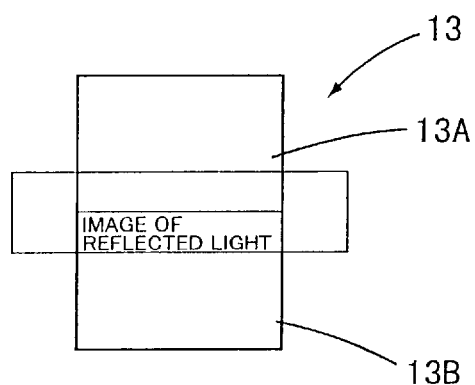
(D) 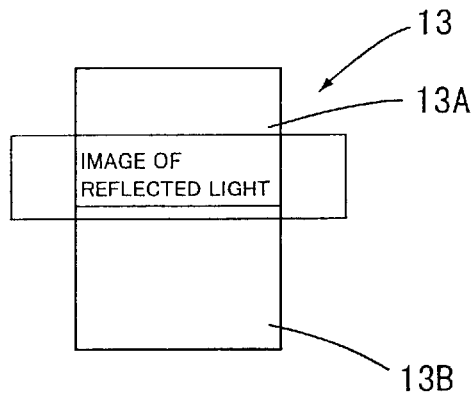

PRIOR ART

SYSTEM FOR DETECTING DISK-SHAPED OBJECT SUCH AS SEMICONDUCTOR WAFER OR MAGNETIC DISK

BACKGROUND OF THE INVENTION

1. Field of the Invention

The present invention relates to a disk-shaped object detecting system for detecting the presence or absence and position of a disk-shaped object such as a semiconductor wafer or magnetic disk without physical contact with the object.

2. Description of the Prior Art

A disk-shaped object detecting system has conventionally been used to detect positions of a number of semiconductor wafers stacked so as to be spaced from one another for the purpose of counting or ejecting them. The wafer 1 generally has an orientation flat 2 formed by cutting off a part of the circumferential edge thereof straight as shown in FIG. 10. The wafers 1 are loaded in a cassette carrier 3 when transported or processed. The carrier 3 has a number of grooves 4 formed on each of opposite inner side walls thereof so that the wafers 1 are placed over the opposite grooves 4, with the, orientation flats 2 being directed toward an opening 3A of the carrier 3.

The conventional detecting system shown in FIG. 10 comprises a reflection type sensor 5 including a light emitting section (not shown) emitting light onto the orientation flat 2 of the wafer 1 while the sensor 5 is moved across the wafers 1. The sensor 5 further includes a light receiving section 5A receiving light reflected on the orientation flat 2 as shown in FIG. 11A. The light receiving section 5A delivers a light signal S having a magnitude according to an amount of received light as shown in FIG. 11B. The magnitude of the light signal S varies with changes in the position of the wafer 1 relative to the light receiving section SA (see FIG. 11A). The detecting system detects the presence or absence and position of each wafer 1 on the basis of the variations in the magnitude of the light signal S. More specifically, when the light signal S exceeds a reference voltage $V_{rf}$, the detecting system determines that the light receiving section 5A confronts the orientation flat 2 of the wafer 1, detecting the position of the wafer 1. Japanese Utility Model Registration Publication Nos. 5-38761 (1993) and 6-70240 (1994) disclose conventional disk-shaped object detecting systems of the above-described type respectively. Japanese Examined Patent Publication No. 1-52897 (1989) and Japanese Unexamined Patent Publication No. 10-116878 (1998) disclose other conventional disk-shaped object detecting systems respectively. Further, U.S. Pat. No. 5,504,345 to Bartunek et al. discloses further another conventional disk-shaped object detecting system.

The light emitting sections of the conventional reflection type sensors 5 include those using light with a small beam width, for example, a laser, and those using light with a large beam width, for example, a light-emitting diode (LED). Since the light has a small beam width in the light emitting section using the laser, a distinct difference in an amount of received light is obtained between a case where the light receiving section 5 confronts the center of the orientation flat 2 with respect to the thickness thereof and a case where the light receiving section 5 is displaced from the center. This results in an advantage that the accuracy in the position detection of the wafer 1 with respect to the thickness thereof can be improved. However, in a case where the orientation flat is cut obliquely with respect to the thickness thereof or rugged, light is obliquely reflected on the orientation flat 2 when the light receiving section 5 confronts the center of the orientation flat 2 with respect to the thickness thereof. As a result, the light is not detected by the light receiving section 5 such that the detection becomes unstable. Further, the laser beam is dangerous to human bodies and the laser is costly.

On the other hand, light emitted from LED is safe for the human bodies and LED is less costly. Moreover, light emitted from LED has a larger beam width and has such an angle as to expand from the light source. As a result, the light receiving section 5 receives a predetermined amount of reflected light irrespective of the shape of the orientation flat 2 when confronting the center of the orientation flat 2 with respect to the thickness thereof, whereupon the detection is rendered stable. However, since the light emitted from LED has a larger beam width, only a small difference in an amount of detected light is obtained between a case where the light receiving section 5 confronts the center of the orientation flat 2 with respect to the thickness thereof and a case where the light receiving section 5 is displaced from the center. Consequently, the light signal S has a trapezoidal waveform with a flat apex as shown in FIG. 11B.

A reference voltage $V_{rf}$ is set at a value slightly smaller than the one of a voltage at the apex in the conventional disk-shaped object detecting system employing LED as the light source as shown in FIG. 11B. The detecting system detects the wafer 1 when the light signal S exceeds the reference voltage $V_{rf}$. However, since the apex of the light signal S becomes flat as described above as shown by reference symbol H in FIG. 11B, the position of the light detecting section 5 covers a wide range when the light signal S exceeds the reference voltage $V_{rf}$ as shown by reference symbol H. As a result, the position of the wafer cannot be detected accurately. Accordingly, when the wafers 1 loaded in the wafer cassette 3 at small pitches in consideration of the manufacturing efficiency are to be taken out, an adjacent wafer 1 is sometimes taken out erroneously, for example.

Further, the orientation flat 2 is sometimes directed obliquely relative to the light receiving section 5A while the wafer 1 is loaded in the cassette 3. Accordingly, light is reflected on the orientation flat 2 in an unintended direction such that the light receiving section SA fails to receive the light, whereby the wafer 1 cannot be detected in spite of the presence of the light.

SUMMARY OF THE INVENTION

Therefore, an object of the present invention is to provide a disk-shaped object detecting system which can perform an accurate detection of the presence or absence and position of the disk-shaped object.

The present invention provides a disk-shaped object detecting system detecting a disk-shaped object having a circumferential edge, the system comprising a light emitting element emitting light toward the circumferential edge of the object while being moved across the object with respect to a direction of thickness of the object. A light receiving element receives the light reflected on the circumferential edge of the object while being moved across the object with respect to the direction of thickness of the object together with the light emitting element, thereby delivering first and second signals each according to the received light. The light receiving element has two opposite ends. The first and second signals have a ratio depending upon at what position between the opposite ends the light receiving element receives the light reflected on the circumferential edge of the object. The first and second signals have a magnitude relation which is reversed when the light reflected on the circumferential edge of the object has been moved from one end side to the other end side of the light receiving element. The system further comprises an AND processing section to which the first and second signals delivered from the light receiving element are supplied, the AND processing section delivering either one of the signals having a smaller magnitude than the other as an output and a determining section determining whether the output of the AND processing section has exceeded a predetermined level.

In the disk-shaped object detecting system of the present invention, a receiving position where the light receiving element receives the light changes as it moves across the object. The magnitudes of the first and second signals delivered from the light receiving element vary according to the receiving position. The AND processing section delivers either one of the signals having a smaller magnitude than the other as an output. A magnitude relation between the first and second signals is reversed when the position where the light receiving element receives the light reflected on the circumferential edge of the object changes. This causes a sudden change in the output of the AND processing section. As a result, a signal having a triangular waveform with a pointed apex is supplied to the determining section. The determining section determines whether the apex of the triangular waveform has exceeded the predetermined level, thereby detecting the disk-shaped object.

According to the present invention, the triangular waveform has a pointed apex, and the detection of the disk-shaped object is based on whether the apex has exceeded the predetermined level. Consequently, since a range in which the triangular waveform is increased above the predetermined level is limited in the present invention as compared with the prior art in which the light signal delivered from the light receiving section has a trapezoidal waveform with a flat apex, a more accurate detection of the position of the object can be performed.

When two light receiving elements are disposed at both sides of the light emitting section respectively, at least one of the light receiving elements receives the reflected light even when the circumferential edge of the object is inclined relative to the light beam. Furthermore, since an optical axis of each of the light receiving elements is inclined toward the other, one of the light receiving elements receives a sufficient amount of light. Further, when one of the signals having a larger magnitude is supplied through the OR processing section to the determining section, an accurate detection can be performed without adverse effects by noise etc.

Some latitude is allowed in an angle of the light relative to the circumferential edge of the object when a condenser lens is provided for condensing the light emitted from the light emitting element to irradiate the condensed light onto the circumferential edge of the object. Moreover, a beam width of the light irradiated onto the circumferential edge of the object can be increased when the condenser lens has on the circumference of the object a larger irradiating area than the thickness of the object. Consequently, even when the object is cut obliquely along the thickness thereof, rounded or rugged, for example, the light receiving element can stably receive the light reflected on the object, thereby ensuring a stable detection.

BRIEF DESCRIPTION OF THE DRAWINGS

Other objects, features and advantages of the present invention will become clear upon reviewing of the following description of the preferred embodiments, made with reference to the accompanying drawings, in which:

FIGS. 5A to 5D show the changes in a position of an image of the reflected light relative to the light detecting element;

DETAILED DESCRIPTION OF THE PREFERRED EMBODIMENTS

Figure 1:
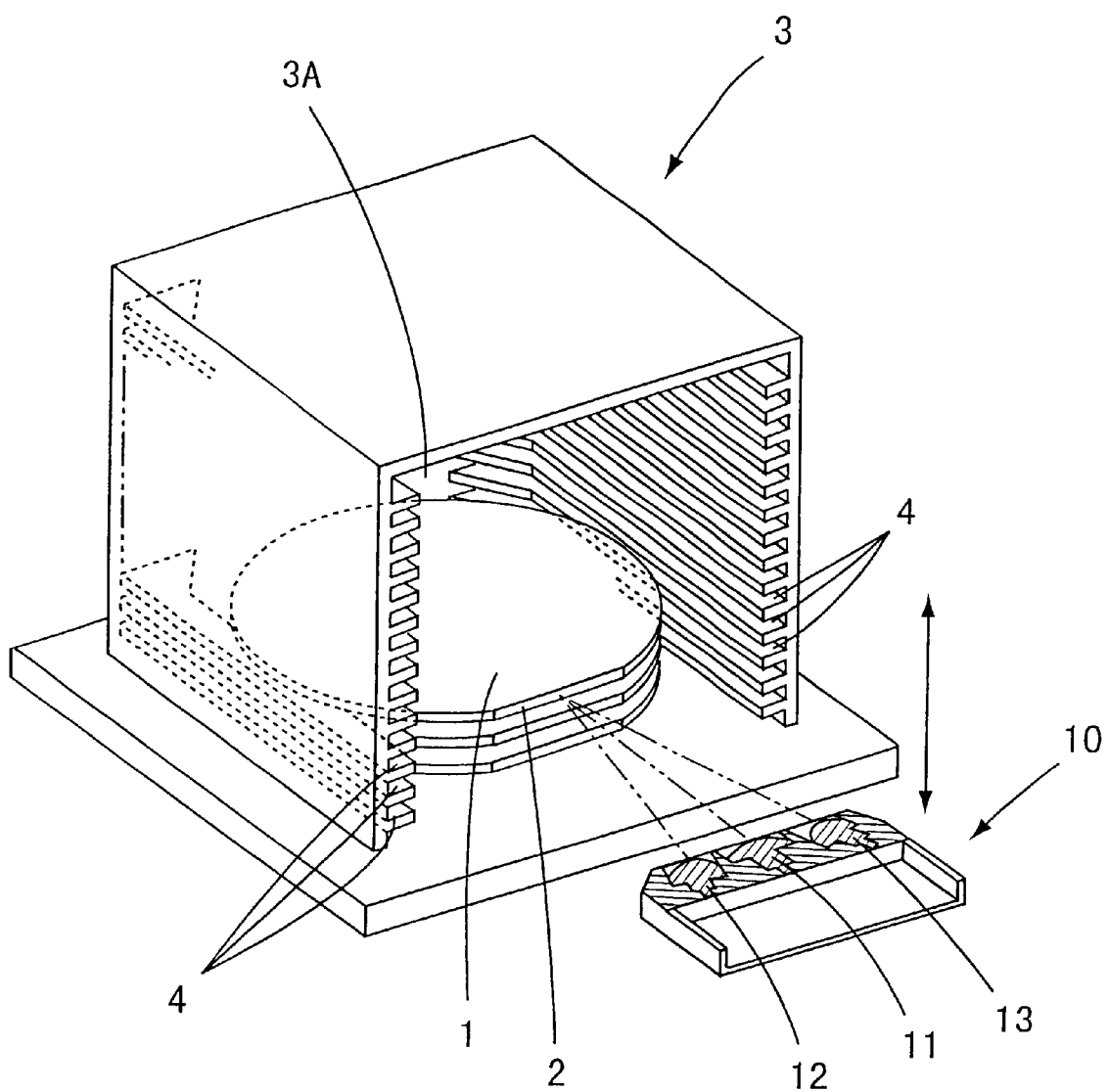
FIG. 1 is a perspective view of a reflection type sensor of the disk-shaped object detecting system of a first embodiment in accordance with the present invention, together with semiconductor wafers loaded in a wafer cassette.

A first embodiment of the present invention will be described with reference to FIGS. 1 to 6C. Referring to FIG. 1, a reflection type sensor 10 incorporated in the disk-shaped object detecting system of the embodiment is shown together with semiconductor wafers 1 loaded in a wafer cassette or carrier 3 and serving as disk-shaped objects to be detected. Each wafer 1 has an orientation flat 2 formed by cutting off a part of the circumferential edge thereof straight. The wafers 1 are loaded in the cassette 3 when transported or processed. The cassette 3 has a front opening 3A and a number of grooves 4 formed on each of opposite inner side walls thereof so that the wafers 1 are placed over the opposite grooves 4 with the orientation flats 2 being directed toward the opening 3A of the carrier 3.

The sensor 10 of the detecting system is moved across the orientation flat 2 of each wafer 1 (vertically in FIG. 1) along the horizontally central opening 3A. The sensor 10 includes a single light emitting element 11, and a left-hand one-dimensional position detecting element 12 and a right-hand one-dimensional position detecting element 13 disposed at both lateral sides of the light emitting element respectively. The light emitting element 11 comprises a light-emitting diode (LED) and has a light emitting face directed straight to the opening 3A of the cassette 3.

Figure 2:
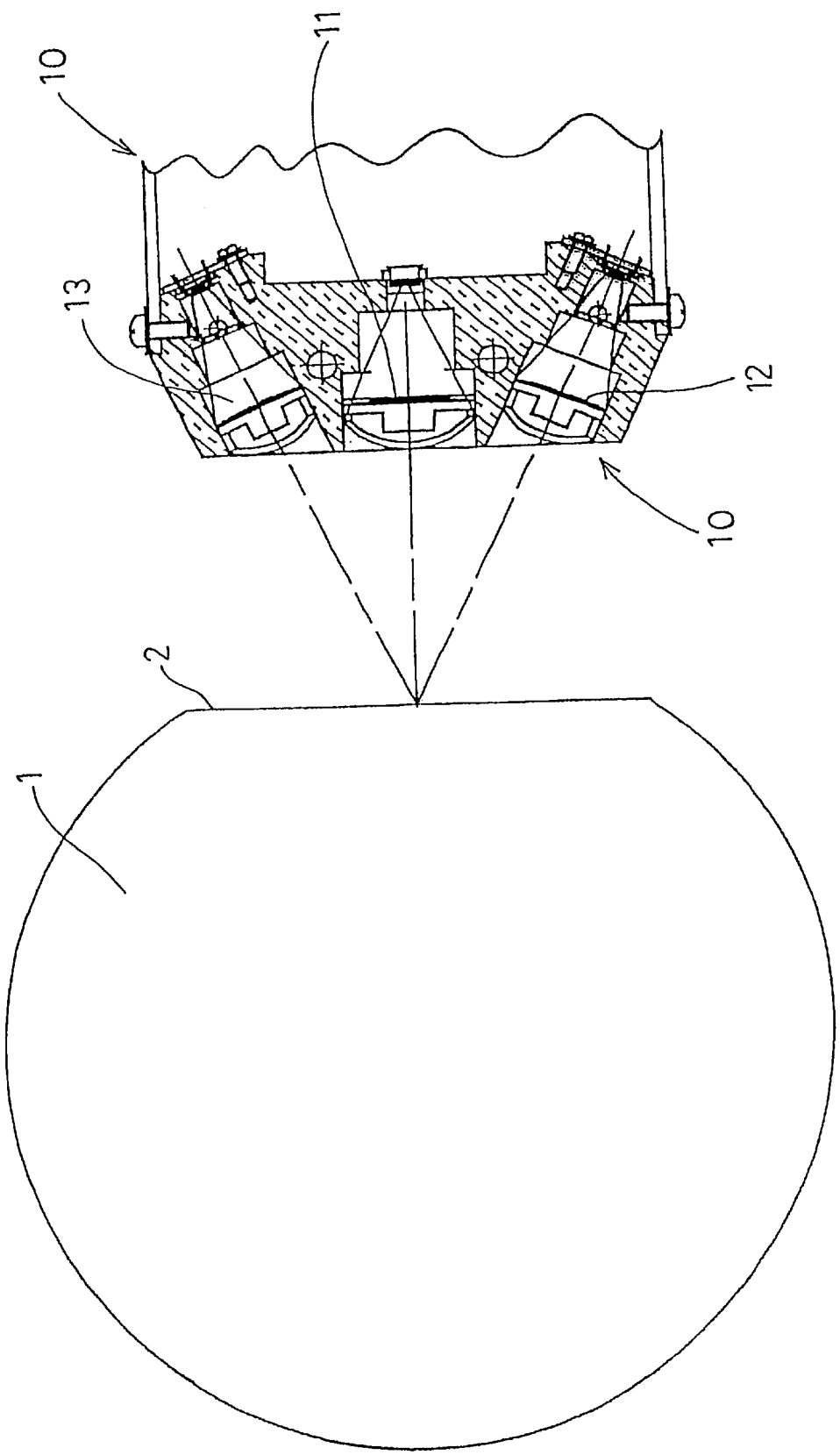
FIG. 2 is a sectional plan view of the reflection type sensor, showing a detecting manner when the wafer is in a normal condition.
Figure 4:
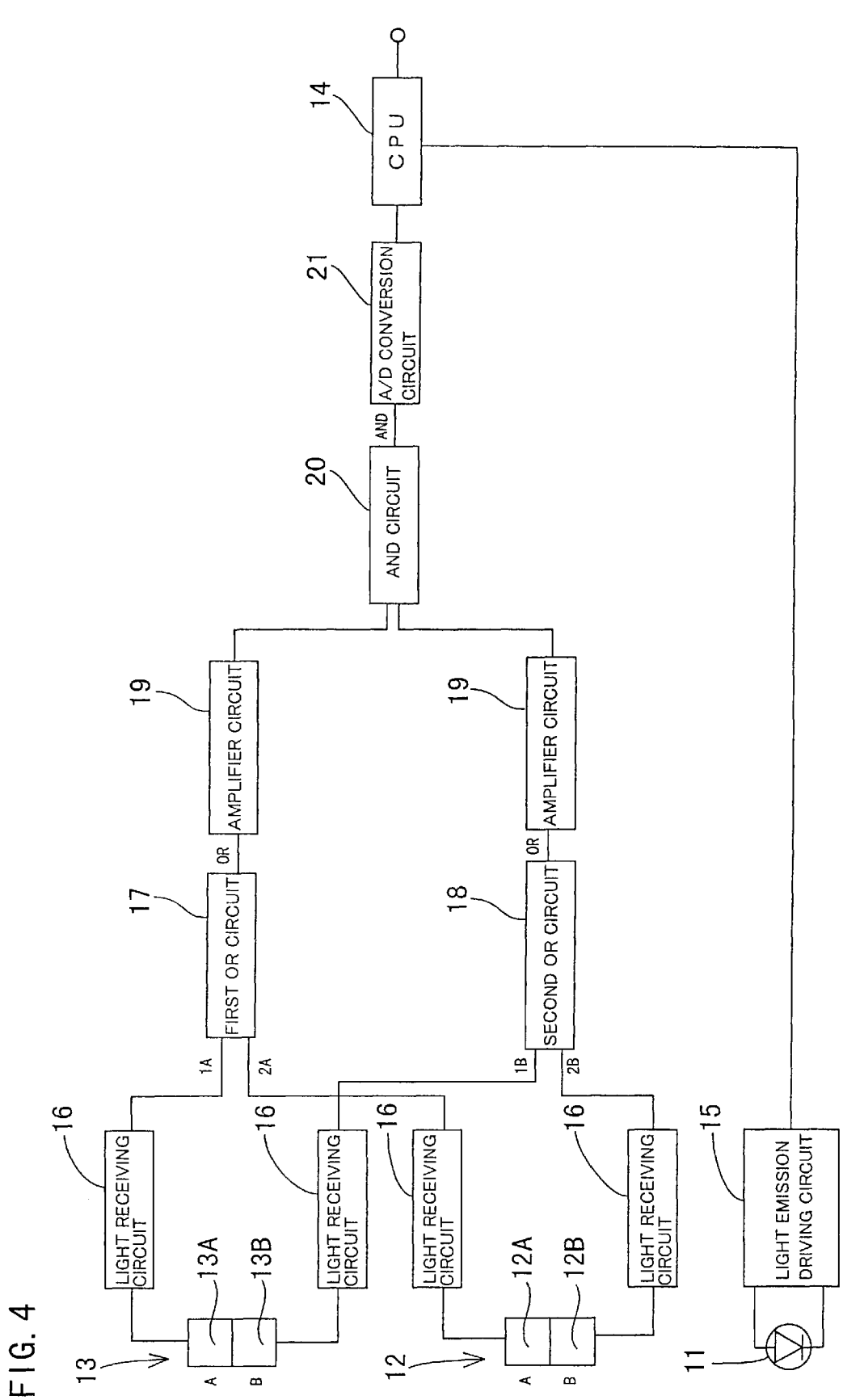
FIG. 4 is a block diagram showing an electrical arrangement of signal processing circuitry of the disk-shaped object detecting system.

Each of the detecting elements 12 and 13 has an optical axis inclined toward the other detecting element as shown in FIG. 2. The light emitting and detecting elements 11, 12 and 13 are disposed so that an intersection of optical axes of these elements is positioned on the orientation flat 2 of each wafer 1. The left-hand detecting element 12 comprises a two-piece element including first and second light receiving sections 12A and 12B formed by dividing a photoelectric material into two parts and packaging the parts as shown in FIG. 4. The left-hand detecting element 12 delivers a first signal (current signal) according to an amount of light received by the first light receiving section 12A and a second signal (current signal) according to an amount of light received by the second light receiving section 12B. The right-hand detecting element 13 also comprises a two-piece element including first and second light receiving sections 13A and 13B as shown in FIG. 4 and delivers a first signal (current signal) according to an amount of light received by the first light receiving section 13A and a second signal (current signal) according to an amount of light received by the second light receiving section 13B. In each of the detecting elements 12 and 13, the first and second light receiving sections are vertically arranged along the direction of movement of the sensor 10. A one-dimensional position sensitive device (PSD) may be used as the light detecting element instead of the aforesaid two-piece element.

A signal processing manner of the detecting system will now be described with reference to FIG. 4 showing signal processing circuitry of the system. The current signals delivered from the first light receiving sections 12A and 13A of the left-hand and right-hand detecting elements 12 and 13 are converted to corresponding voltage signals by light receiving circuits 16 respectively. The voltage signals are supplied to a first OR circuit 17, which delivers either one of the supplied voltage signals having a larger magnitude than the other. When the magnitudes of the supplied voltage signals are equal to each other, the first OR circuit 17 delivers a signal with the equal magnitude.

The current signals delivered from the second light receiving sections 12B and 13B of the left-hand and right-hand detecting elements 12 and 13 are also converted to corresponding voltage signals by other light receiving circuits 16 respectively. The voltage signals are supplied to a second OR circuit 18, which delivers either one of the supplied voltage signals having a larger magnitude than the other. When the magnitudes of the supplied voltage signals are equal to each other, the second OR circuit 18 delivers a signal with the equal magnitude.

The first and second signals delivered from the first and second OR circuits 17 and 18 are supplied via amplifier circuits 19 to an AND circuit 20 respectively. The AND circuit 20 delivers either one of the supplied signals having a smaller magnitude than the other. The signal delivered from the AND circuit 20 is supplied via an analog-to-digital (A/D) conversion circuit 21 to a CPU 14. The CPU 14 compares the supplied signal with a reference value:, thereby detecting the presence or absence of the wafer 1. The CPU 14 delivers a pulse signal to a light emission driving circuit 15 driving the light emitting element 11 so that light is emitted from the element. A position detector (not shown) is provided in the detecting system for detecting a current position of the sensor 10 to thereby deliver a signal, which signal is supplied to the CPU-14.

The operation of the detecting system will now be described. Upon start of the detecting system, the CPU 14 delivers the pulse signal to the driving circuit 15 so that the sensor 10 is moved downward while the light emitting element 11 emits light. At this time, the position detector supplies position data concerning the current position of the sensor 10 to the CPU 14, and the signals delivered from the first and second light receiving portions 12A, 13A, 12B and 13B of the detecting elements 12 and 13 are supplied to the first and second OR circuits 17 and 18 for comparison respectively. However, the signals delivered from both detecting elements 12 and 13 are at the same low level while the light emitted from the light emitting element 11 does not impinge on the wafer 1.

Figure 3:
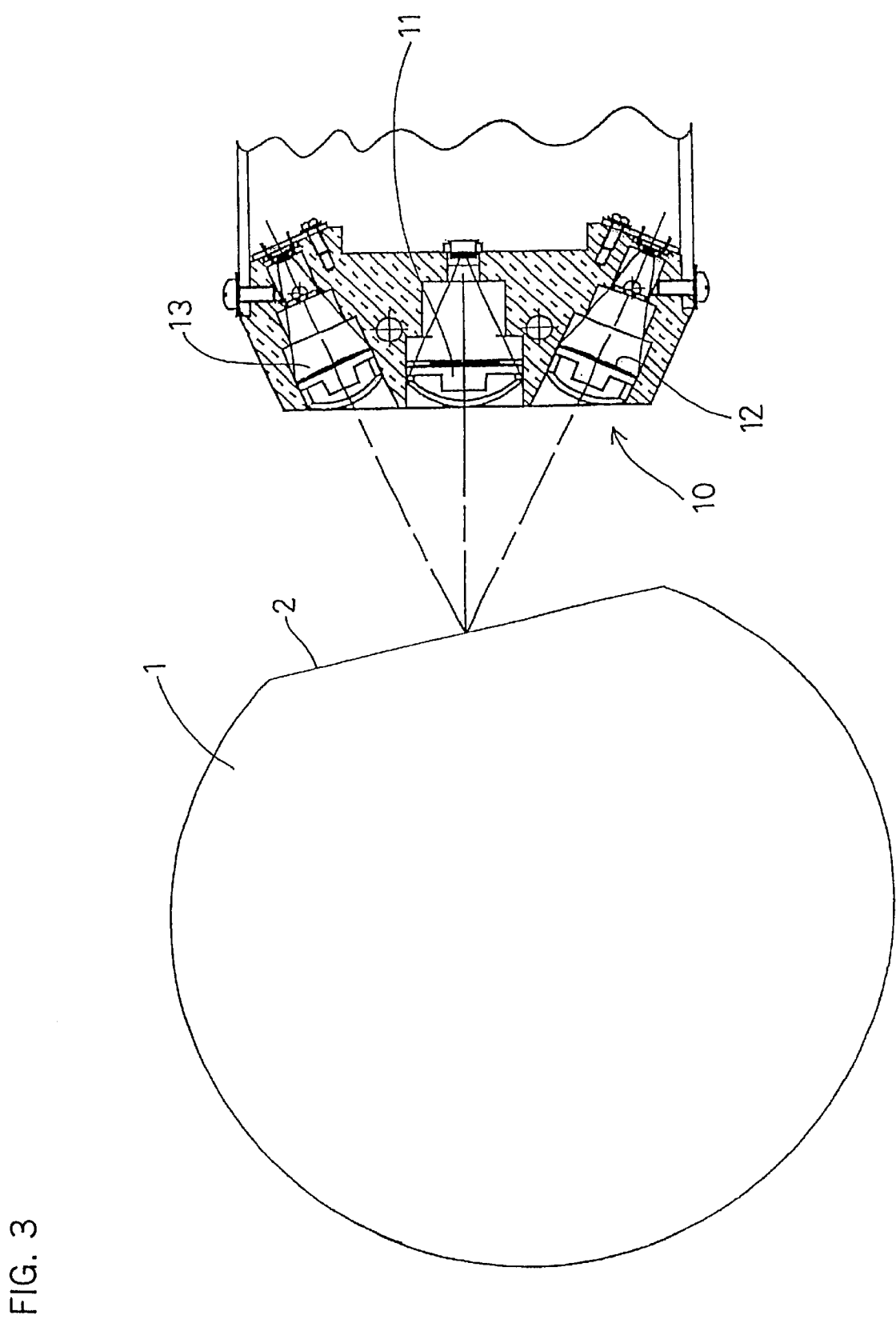
FIG. 3 is a sectional plan view of the reflection type sensor, showing a detecting manner when an orientation flat of the wafer is inclined.

When the sensor 10 approaches the uppermost wafer 1 in the cassette 3 such that the light emitted from the light emitting element 11 impinges on that wafer 1, the light is reflected on the orientation flat 2 of the wafer to be received by the lower positioned second light receiving sections 12B and 13B. The second light signals (current signals) delivered from the second light receiving portions 12B and 13B are converted by the light receiving circuits 16 to the voltage signals respectively. The converted voltage signals are supplied to the second OR circuit 18 for comparison. Assume now that the orientation flat 2 of the wafer 1 is displaced from its normal state such that it is inclined toward the left-hand detecting element 12 side as shown in FIG. 3. Accordingly, the orientation flat 2 is not perpendicular to the light impinging thereon. In this case, the right-hand detecting element 13 receives a larger amount of reflected light than the left-hand detecting element 12, whereupon the magnitude of the second light signal delivered from the right-hand element 13 is larger than that of the second light signal delivered from the left-hand element 12. As a result, the second light signal from the right-hand element 13 is delivered from the second OR circuit 18 as the output signal to be supplied to the AND circuit 20.

The first light receiving sections 12A and 13A also receive the reflected light when the sensor 10 is further moved. The first OR circuit 17 compares the first light signals delivered from the respective first light receiving sections 12A and 13A. Since the orientation flat 2 of the wafer 1 is still inclined to the right, the magnitude of the first light signal delivered from the right-hand detecting element 13 is larger than that of the first light signal delivered from the left-hand detecting element 12. Consequently, the first light signal from the element 13 is delivered from the first OR circuit 18 as the output signal to be supplied to the AND circuit 20.

Figure 6:
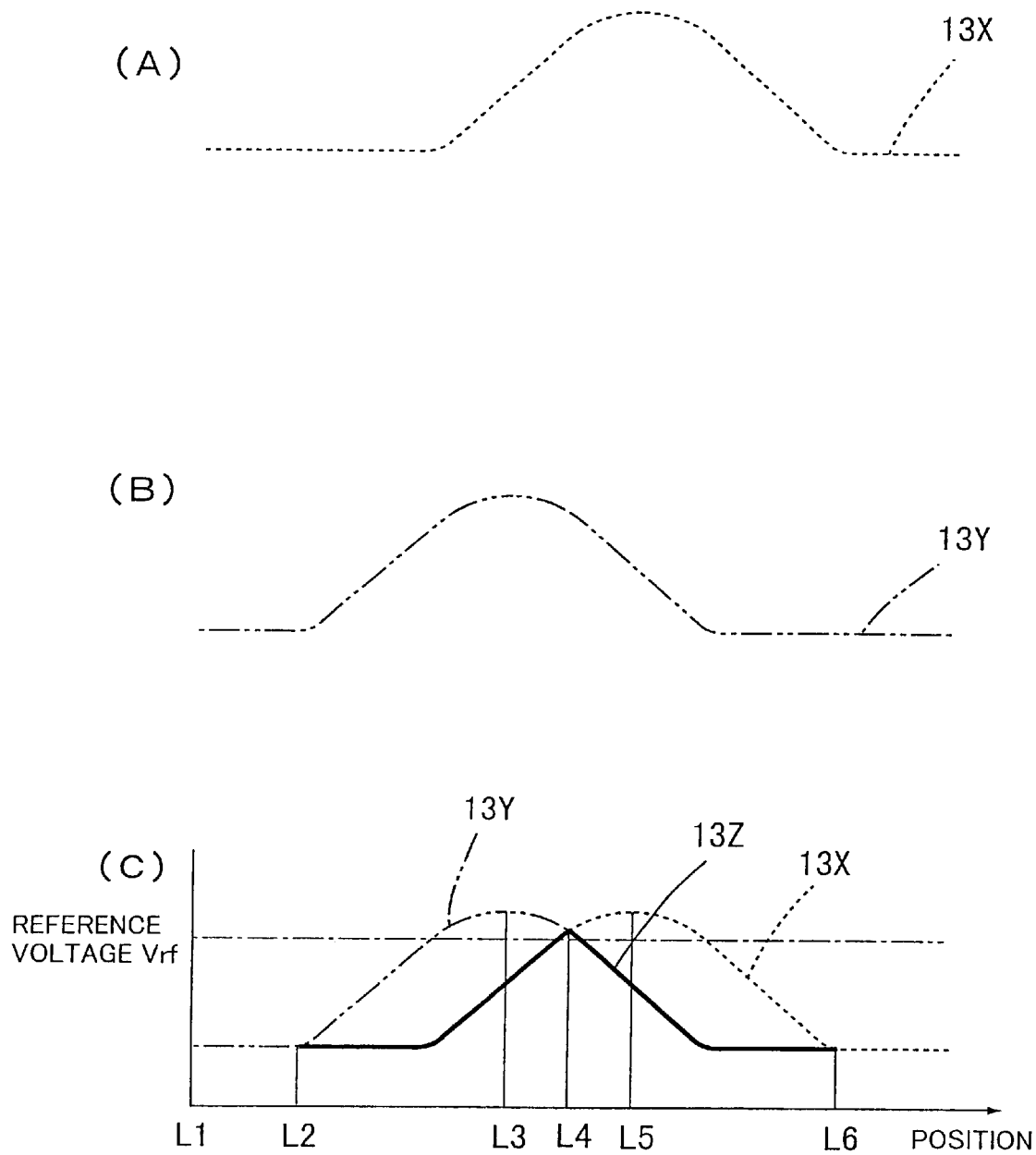
FIGS. 6A and 6B are graphs showing two input signals supplied to an AND circuit respectively.
FIG. 6C is a graph showing both input signals and an output signal with respect to the AND circuit.

The first and second light signals both delivered from the right-hand detecting element 13 are thus supplied to the AND circuit 20 when the orientation flat 2 is inclined to the right as described above. The AND circuit 20 delivers either one of the supplied light signals having a smaller magnitude as the output signal. The operation of the AND circuit 20 will be described in detail with reference to FIGS. 5A to 6C. FIGS. 5A to 5D show the changes in a position of an image of the reflected light relative to the right-hand detecting element 13. FIGS. 6A and 6B are graphs showing two input signals 13X and 13Y supplied from the right-hand detecting element 13 to the AND circuit 20 respectively. FIG. 6C is a graph showing both input signals supplied to and an output signal 13Z delivered from the AND circuit 20.

The magnitudes of the first and second light signals 13X and 13Y are gradually increased as the sensor 10 approaches the wafer 1. Since both light receiving sections 13A and 13B are arranged vertically, the first light signal 13X delivered from the first light receiving section 13A lags behind the second light signal 13Y delivered from the lower second light receiving section 13B. Accordingly, the magnitude of the first light signal 13X is smaller than that of the second light signal 13Y for a short while after the second light receiving section 13B starts receiving the reflected light, as shown by positions L2 and L3 in FIG. 6C. As a result, the AND circuit 20 delivers the first light signal 13X as shown by a left-hand part of solid line in FIG. 6C.

An amount of light received by the second light receiving section 13B reaches a peak when the sensor 10 is moved to such a position that the orientation flat 2 of the wafer 1 confronts the center of the second light receiving section 13B, as shown by position L3 in FIG. 6C. The amount of light received by the light receiving section 13B and accordingly the magnitude of the second light signal 13Y are gradually reduced when the sensor 10 passes the position. Thus, the second light signal 13Y has a trapezoidal waveform with a gently curved peak.

The magnitude of the second light signal 13Y is reduced and that of the first light signal 13X is increased when the first light receiving section 13A approaches the orientation flat 2 of the wafer 1, as shown in FIG. 5B. As a result, the magnitudes of both signals 13X and 13Y approximate to each other. When the boundary of both light receiving sections 13A and 13B confronts the orientation flat 2 as shown in FIG. 5C, amounts of light received by the respective light receiving sections 13A and 13B and accordingly the magnitudes of the respective signals 13X and 13Y become equal to each other, as shown by position L4 in FIG. 6C. The magnitude of the second signal 13Y becomes smaller than that of the first signal 13X when the first light receiving section 13A further approaches the orientation flat 2 as shown in FIG. 5D. More specifically, the signal delivered from the AND circuit 20 is switched from the second light signal 13Y to the first light signal 13X when the sensor 10 has passed the position L4 where the boundary of the light receiving sections 13A and 13B confronts the orientation flat 2 of the wafer 1, as shown by solid line in FIG. 6C. The first light signal 13X then reaches a peak thereof and thereafter, its magnitude is reduced. Consequently, the signal delivered from the AND circuit 20 suddenly changes its magnitude when a magnitude relation between the first and second signals 13X and 13Y is reversed. As a result, a signal having a triangular waveform with a pointed apex is delivered as shown in FIG. 6C.

The signal delivered from the AND circuit 20 is converted by the A/D conversion circuit 21 to a corresponding digital signal. The digital signal is supplied to the CPU 14 to be compared with the reference voltage. The CPU 14 detects the presence of the wafer 1 at a position corresponding to the position data (see position L4 in FIG. 6C) supplied thereto when the digital signal exceeds the reference voltage.

According to the above-described embodiment, the triangular waveform with the pointed apex is formed on the basis of the two light signals. The detection of the wafer 1 is based on whether the apex has exceeded the reference level. Consequently, since a range in which the triangular waveform is increased above the reference level is limited in the embodiment as compared with the prior art, a more accurate detection of the position of the object can be performed. Further, a pair of detecting elements 12 and 13 are disposed at both sides of the light emitting element 11 respectively. Consequently, the case where the reflected light is not received can be prevented even when the orientation flat 2 is inclined. Moreover, since each of the optical axes of the detecting elements 12 and 13 is inclined toward the other, one of the light detecting elements receives a sufficient amount of light. The detecting elements 12 and 13 deliver the light signals respectively. Since either one of the light signals having a larger magnitude is supplied via the OR circuit 17 or 18 to the CPU 14, an accurate detection can be performed without adverse effects by noise etc.

The orientation flat 2 is inclined in the foregoing description. However, when the orientation flat 2 is not inclined as shown in FIG. 2, the light emitted from the light emitting element 11 is reflected on the orientation flat 2 and equally received by the detecting elements 12 and 13. When the magnitudes of the signals delivered from the respective detecting elements 12 and 13 are equal to each other, the signal having the same magnitude is supplied via the OR circuit 17 or 18 to the AND circuit 20 to be processed.

Figure 7:
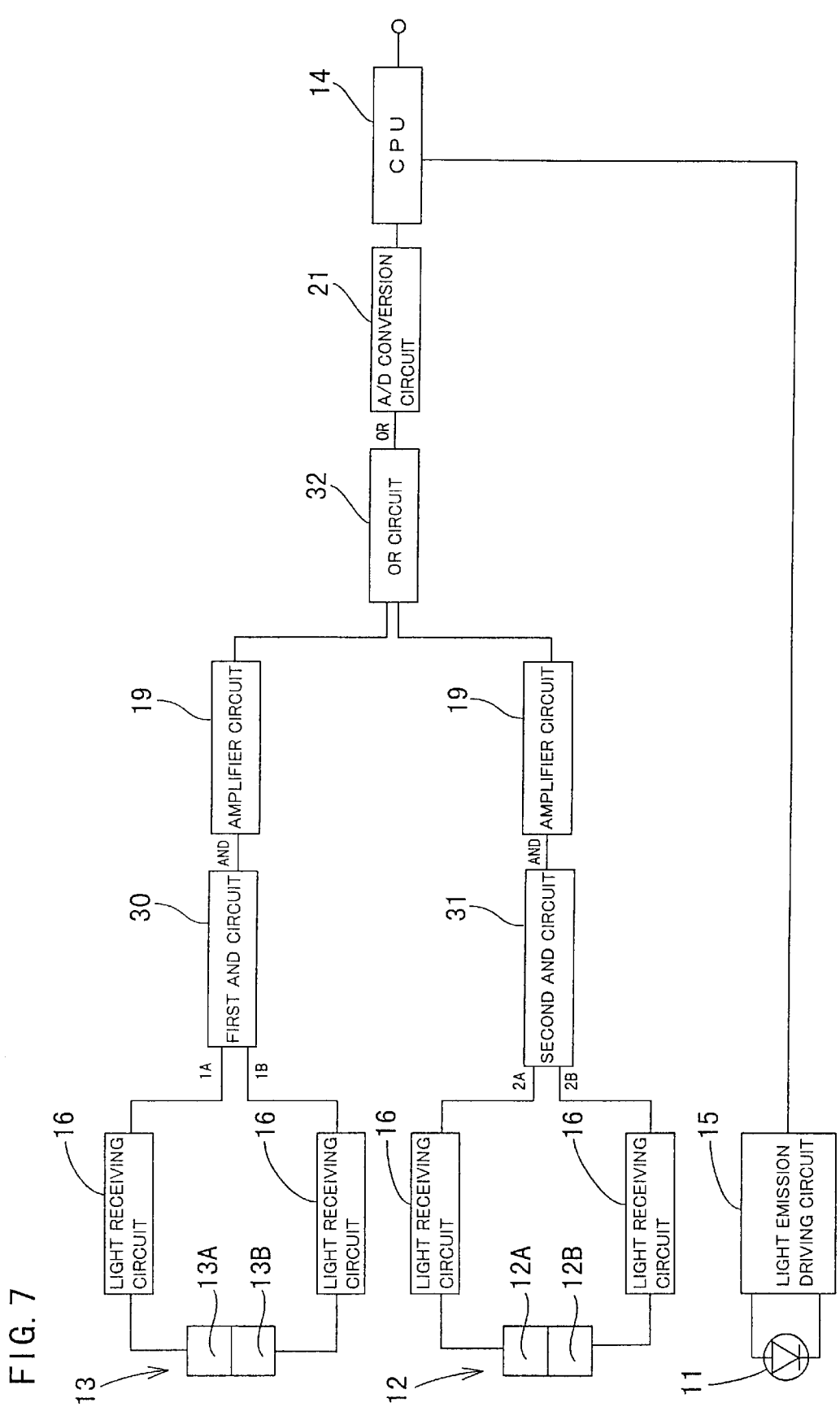
FIG. 7 is a block diagram showing the electrical arrangement of signal processing circuitry of the disk-shaped object detecting system of a second embodiment in accordance with the invention.

FIG. 7 illustrates a second embodiment of the invention. In the second embodiment, the light signals delivered from the first and second light receiving sections 12A and 12B of the left-hand detecting element 12 are converted by the light receiving circuits 16 to the voltage signals respectively. The voltage signals are supplied to a first AND circuit 3 1. Further, the light signals delivered from the first and second light receiving sections 13A and 13B of the right-hand detecting element 13 are also converted by the light receiving circuits 16 to the voltage signals respectively. The voltage signals are supplied to a second AND circuit 30. Each of the AND circuits 30 and 31 delivers either one of the supplied signals having a smaller magnitude than the other, thereby producing the triangular waveform with a pointed apex. The other arrangement of the system of the second embodiment is the same as that of the first embodiment.

Both AND circuits 30 and 31 deliver the output signals having the triangular wave forms respectively. The signals are supplied via the respective amplifier circuits 19 to an OR circuit 32. The OR circuit 32 delivers either one of the signals having a larger magnitude than the other. The signal delivered from the OR circuit 32 is supplied via the A/D conversion circuit 21 to the CPU 14. The CPU 14 compares the supplied signal with the reference voltage, thereby detecting the wafer 1. The same effect can be achieved from the second embodiment as from the first embodiment even when the OR circuits in the first embodiment are replaced by the AND circuits in the second embodiment and the AND circuit in the first embodiment is replaced by the OR circuit in the second embodiment.

Figure 8:
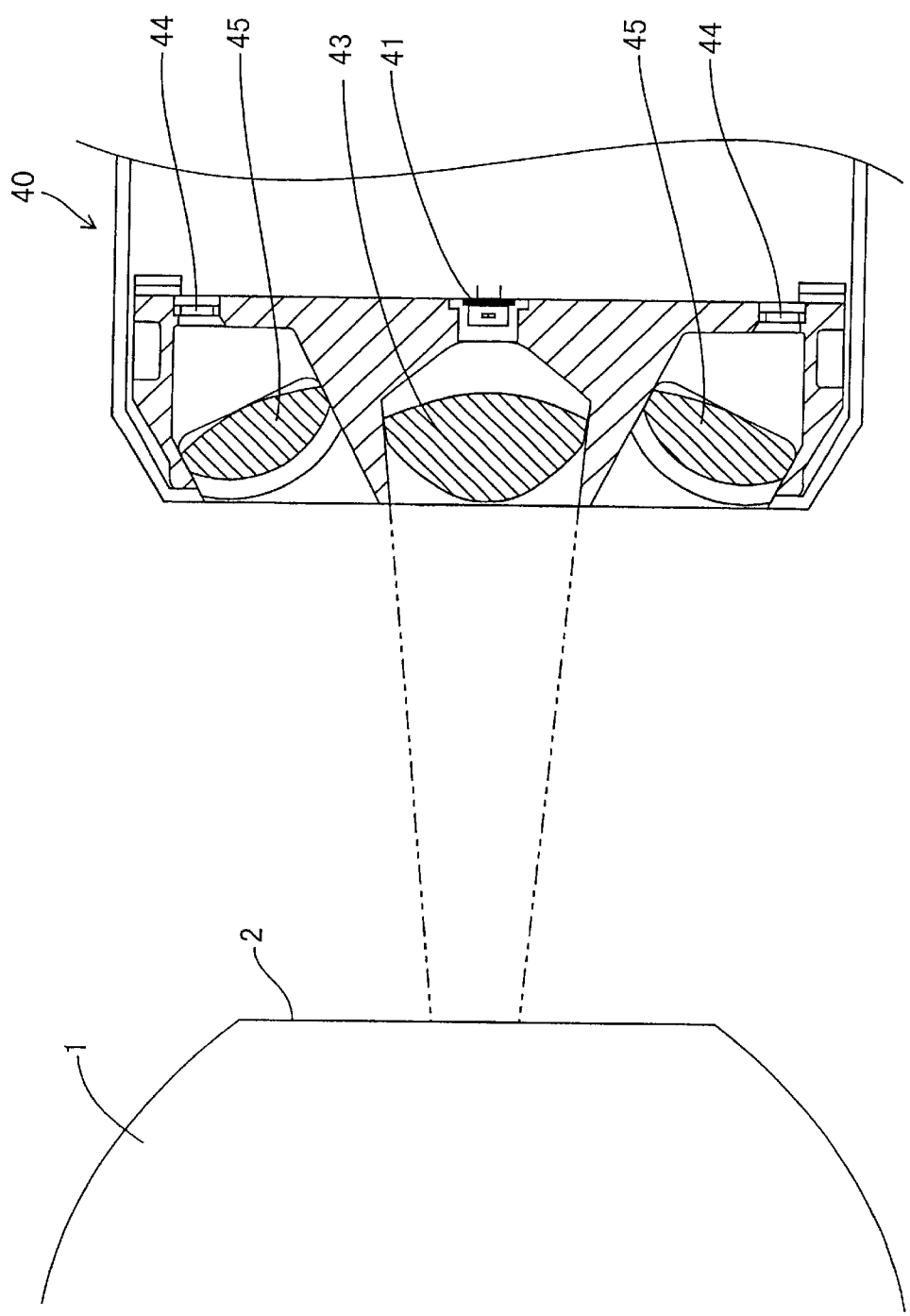
FIG. 8 is a sectional plan view of the reflection type sensor of the disk-shaped object detecting system of a third embodiment in accordance with the invention.
Figure 9:
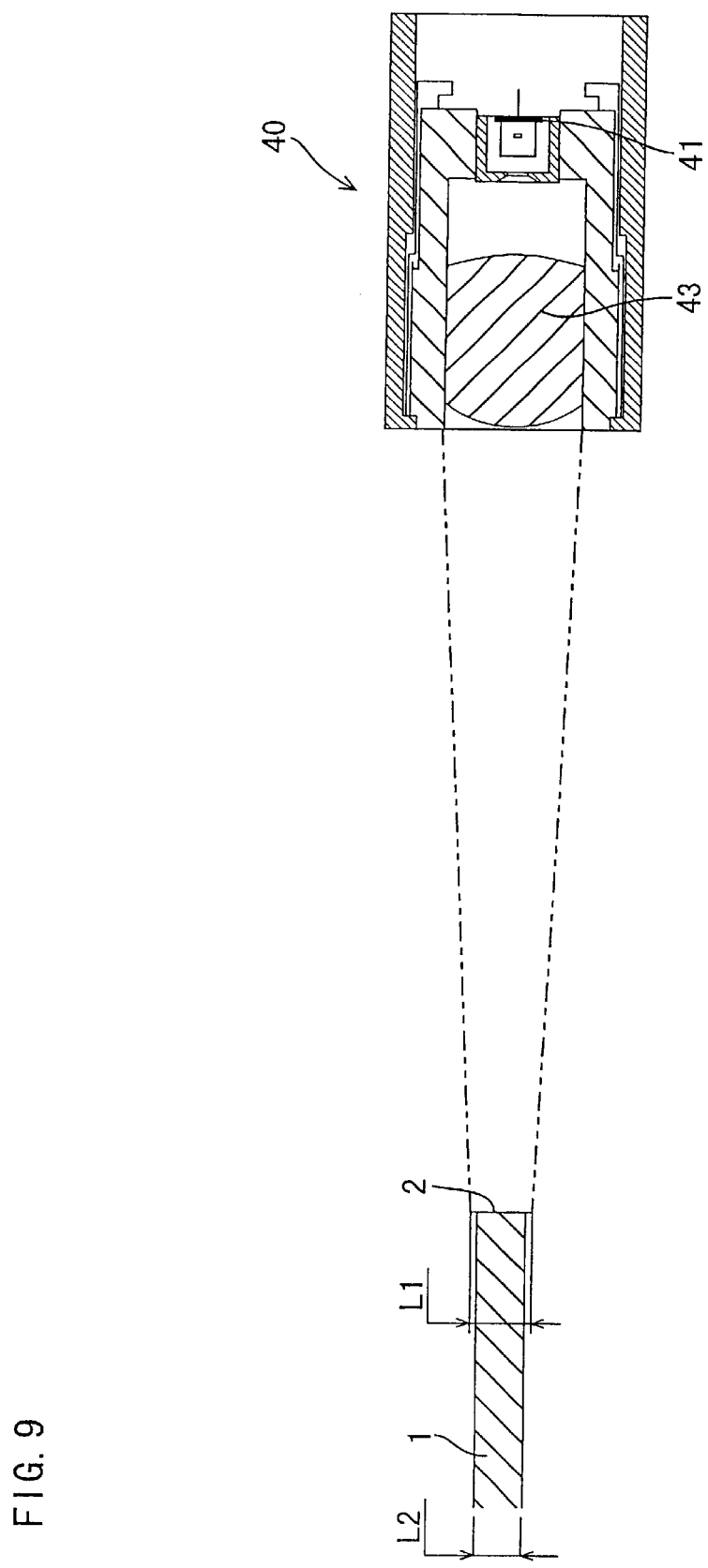
FIG. 9 is a sectional side view of the reflection type sensor of the detecting system.
Figure 10:
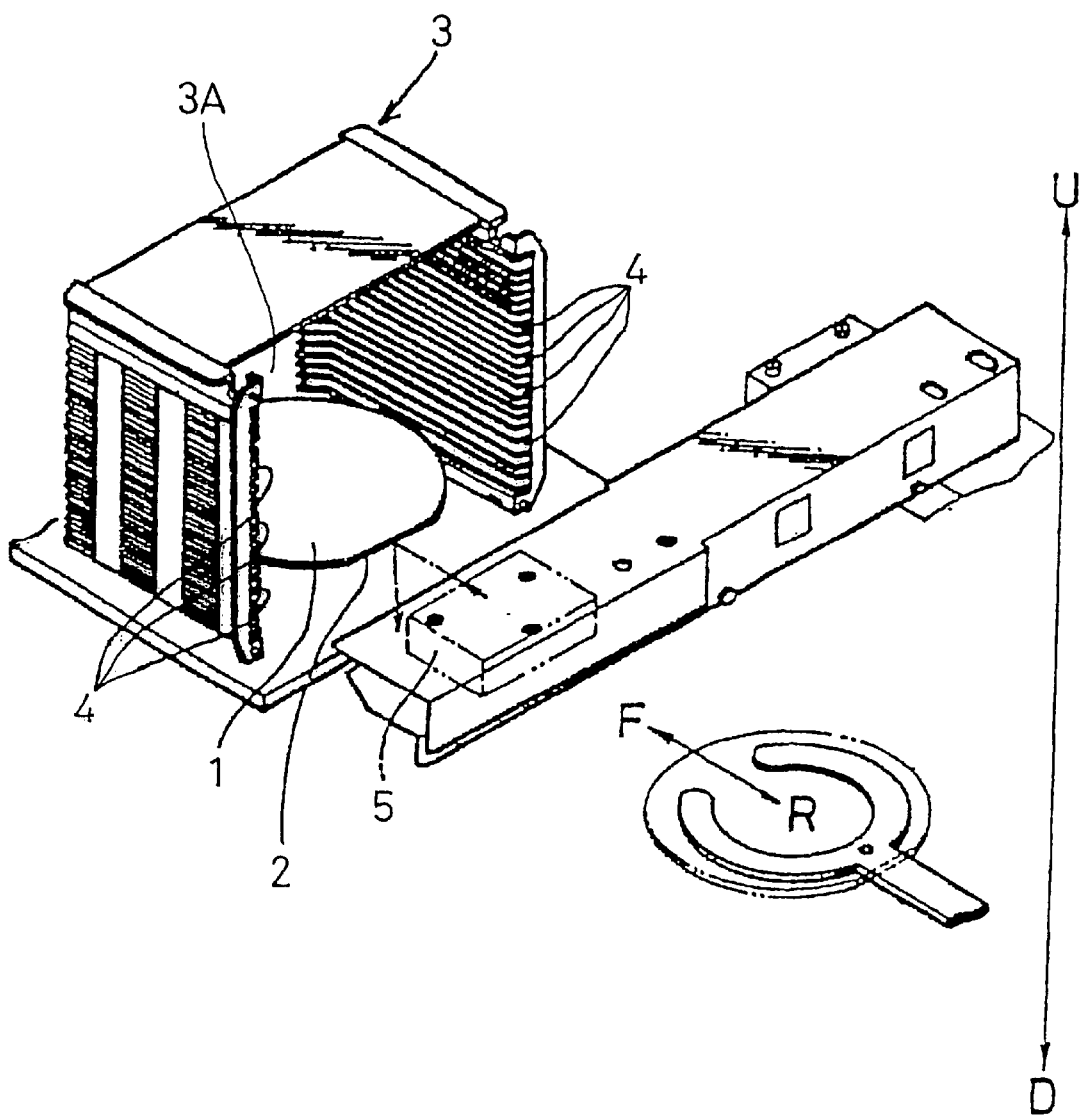
FIG. 10 is a perspective view of a conventional disk-shaped object detecting system, together with semiconductor wafers loaded in a wafer cassette.
Figure 11:
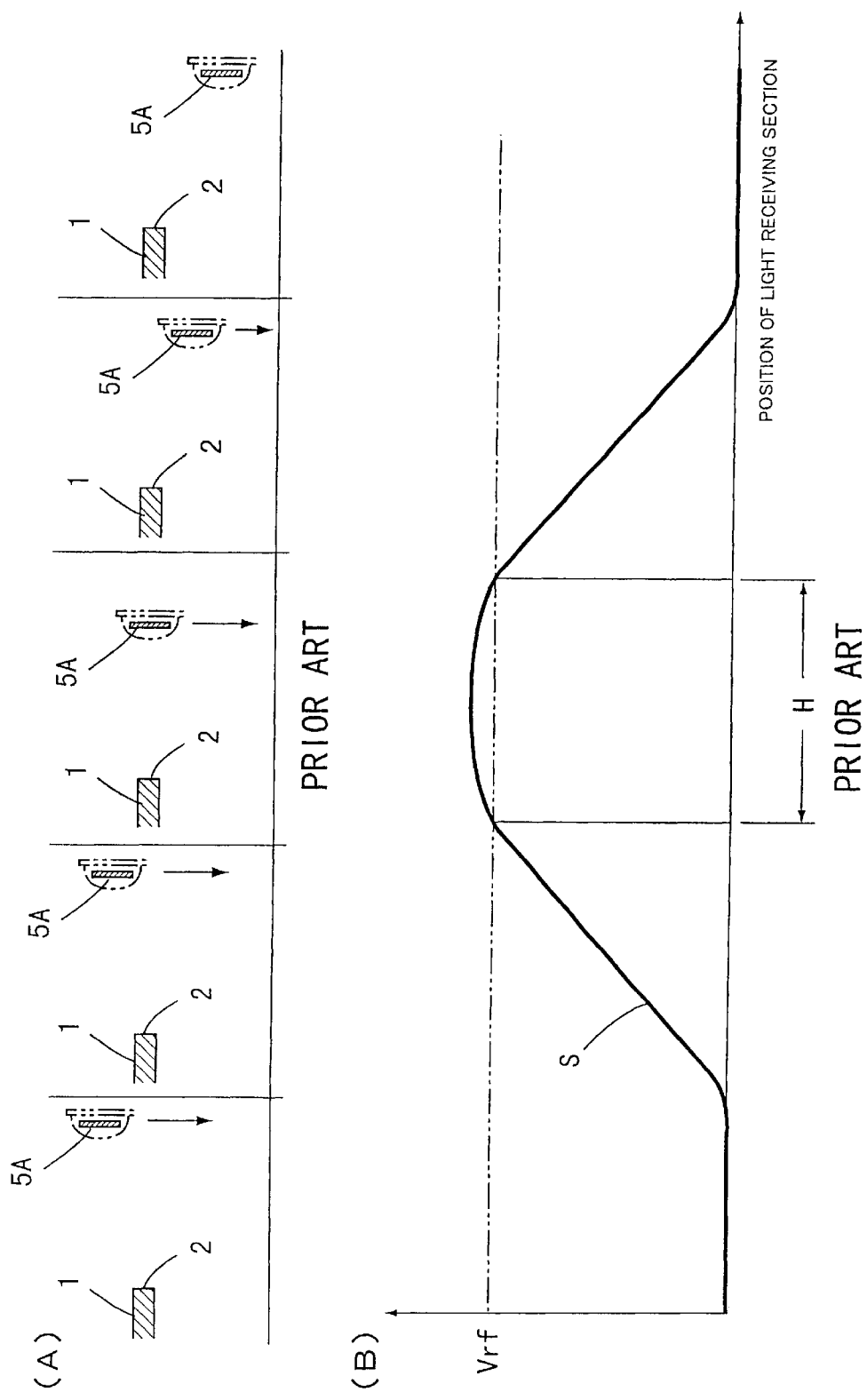
FIGS. 11A and 11B show the detecting manner of the conventional system and a signal delivered from the system respectively.

FIGS. 8 and 9 illustrate a third embodiment of the invention. In the third embodiment, the sensor 40 has a different structure from that of the sensor 10 in the first embodiment. A condenser lens 43 is provided in front of the light emitting element 41 (LED) of the sensor 40 in the third embodiment. The condenser lens 43 has a generally rectangular shape as viewed at the wafer 1 side. The condenser lens 43 has on the orientation flat 2 a larger irradiating area L1 than a thickness L2 of the wafer 1 as shown in FIG. 9.

The condenser lens 43 has a larger horizontal dimension than a vertical dimension thereof as viewed at the wafer 1 side. However, the vertical dimension of the lens 43 may be larger than the horizontal dimension thereof, instead. Alternatively, the vertical dimension may be equal to the horizontal dimension. Furthermore, two condenser lens 45 are provided in front of the respective detecting elements 44. Each condenser lens 45 also has a rectangular shape as viewed at the wafer 1 side. Each condenser lens 45 is disposed so as to confront the orientation flat 2 such that the distance between the lens and the orientation flat 2 becomes slightly shorter than its focal distance. The other arrangement of the system of the third embodiment is the same as that of the first embodiment.

The same effect can be achieved from the third embodiment as from the first embodiment. Further, the light emitted from the light emitting element 41 is condensed by the condenser lens 43 into the orientation flat 2, whereupon some latitude is allowed in an angle of the light relative to the circumferential edge of the object. Moreover, the irradiating area L1 of the condenser lens 43 is set to be larger than the thickness L2 of the wafer 1. Consequently, even when the orientation flat 2 is cut obliquely along the thickness of the wafer 1, rounded or rugged, for example, each light detecting element 44 reliably receives the light reflected on the orientation flat 2 when confronting the latter, thereby ensuring a stable detection. In the arrangement of the third embodiment, the intensity of the light reflected on the orientation flat 2 is decreased since the beam width of the light emitted from the light emitting element is increased. However, the system of the third embodiment is provided with the signal processing circuitry which is the same as that in the first embodiment. Accordingly, the triangular waveform with the pointed apex is produced on the basis of the two light signals. The detection of the wafer 1 is based on whether the apex exceeds the reference level. Consequently, since a range in which the apex of the waveform is increased above the reference level is limited, a more accurate detection of the position of the wafer 1 can be performed.

Several modified forms will now be described. Although the semiconductor wafers 1 are used as the disk-shaped objects in each of the foregoing embodiments, magnetic disks may be used as the disk-shaped objects, instead. Further, the disk-shaped objects should not be limited to substrates used in electric appliances. However, the disk-shaped objects may be dials of watches, flat lids mounted on cases, pulleys, washers, etc. so far as they are disk-shaped.

In the first embodiment, the AND processing section comprises an analog circuit such as the AND circuit provided between the detecting elements 12 and 13 and the CPU 14. Alternatively, the AND processing section may comprise a CPU. More specifically, the signals delivered from the respective OR circuits 17 and 18 may be converted by the A/D conversion circuit 21 to corresponding digital signals. The digital signals may be supplied to the CPU 14, which selects either one of the signals having a smaller magnitude than the other by the processing on a program.

Furthermore, each OR circuit may comprise a CPU. More specifically, the signals delivered from the respective detecting elements 12 and 13 may be converted by the A/D conversion circuit 21 to the digital signals. The digital signals may be supplied to the CPU 14, which selects either one of the signals having a larger magnitude.

In the first embodiment, the position data from the position detector is supplied to the CPU 14 of the reflection type sensor 10 together with the signals from the respective detecting elements 12 and 13, so that the position data and the signals are processed together. However, for example, the position data may not be supplied to the CPU 14 and only the signals from the respective detecting elements may be supplied to the CPU so that only the detection of the disk-shaped object is performed when the apex of the triangular waveform has exceeded the reference level. In this case, both the result of detection of the disk-shaped object by the reflection type sensor and the position data may be supplied to an external controller provided independent of the reflection type sensor so that the position of the disk-shaped object is detected.

Furthermore, the overall reflection type sensor including the light emitting and receiving circuits together with the light emitting and receiving elements may be moved, or only the light emitting and detecting elements may be movable whereas the other circuits etc. may be immovable..

The foregoing description and drawings are merely illustrative of the principles of the present invention and are not to be construed in a limiting sense. Various changes and modifications will become apparent to those of ordinary skill in the art. All such changes and modifications are seen to fall within the scope of the present invention as defined by the appended claims.

What is claimed is:

1. A disk-shaped object detecting system detecting a disk-shaped object having a circumferential edge, the system comprising:

a light emitting element emitting light toward the circumferential edge of the object while being moved across the object with respect to a direction of thickness of the object;

a light receiving element receiving the light reflected on the circumferential edge of the object while being moved across the object with respect to the direction of thickness of the object together with the light emitting element, thereby delivering first and second light signals each according to the received light, the light receiving element having two opposite ends, the first and second light signals having a ratio depending upon at what position between the opposite ends the light receiving element receives the light reflected on the circumferential edge of the object, the first and second signals having a magnitude relation which is reversed when the light reflected on the circumferential edge of the object has been moved from one end side to the other end side of the light receiving element;

an AND processing section to which the first and second light signals delivered from the light receiving element are supplied, the AND processing section delivering either one of the light signals having a smaller magnitude than the other as an output thereof; and a determining section determining whether the output of the AND processing section has exceeded a predetermined level.

2. The system, according to claim 1, wherein a pair of the light receiving elements are disposed at both sides of the light emitting element respectively so that the light emitting element and the light receiving elements are aligned in a direction perpendicular to a direction in which the elements are moved, the light receiving elements having respective optical axes each of which is inclined toward the other.

3. The system according to claim 2, further comprising:

a first OR processing section to which the first light signals delivered from the light receiving elements respectively are supplied, the first OR processing section delivering either one signal having a magnitude larger than the other; and a second OR processing section to which the second light signals delivered from the light receiving elements respectively are supplied, the second OR processing section delivering either one signal having a larger magnitude than the other, wherein the AND processing section is supplied with the signals delivered from the first and second OR processing sections respectively, delivering either one signal having a smaller magnitude than the other.

4. The system according to claim 2, wherein the AND processing section includes a first AND processing section supplied with the first and second light signals both delivered from either one of the light receiving elements to thereby deliver either one of the signals having a smaller magnitude than the other, and a second AND processing section supplied with the first and second light signals delivered from the other light receiving elements to thereby deliver either one of the signals having a smaller magnitude than the other, and which further comprises an OR processing section provided between the determining section and the first and second AND processing sections to be supplied with the output signals delivered from the first and second AND processing sections respectively to thereby deliver either one of the output signals having a larger magnitude than the other, the determining section being supplied with the output signal delivered from the OR processing section.

5. The system according to claim 1, further comprising a condenser lens condensing the light emitted from the light emitting element to irradiate the condensed light onto the circumferential edge of the object, the condenser lens having on the circumferential edge of the object a larger irradiating area than the thickness of the object.

6. The system according to claim 3, further comprising a condenser lens condensing the light emitted from the light emitting element to irradiate the condensed light onto the circumferential edge of the object, the condenser lens having on the circumferential edge of the object a larger irradiating area than the thickness of the object.

7. The system according to claim 4, further comprising a condenser lens condensing the light emitted from the light emitting element to irradiate the condensed light onto the circumferential edge of the object, the condenser lens having on the circumferential edge of the object a larger irradiating area than the thickness of the object.

8. The system according to claim 5, wherein the condenser lens has a generally rectangular shape as viewed at the object side.

9. The system according to claim 2, wherein the light emitting element and the light receiving elements are disposed so that an intersection of optical axes of the light emitting and receiving elements is positioned on the circumferential edge of the object.

10. The system according to claim 1, wherein the light emitting element comprises a light-emitting diode (LED).

11. The system according to claim 3, wherein the light emitting element comprises a light-emitting diode (LED).

12. The system according to claim 4, wherein the light emitting element comprises a light-emitting diode (LED).

13. The system according to claim 3, wherein when the signals supplied into each OR processing section have magnitudes equal to each other, each OR processing section delivers the signal having a magnitude equal to those of the signals supplied thereto.

14. The system according to claim 4, wherein when the signals supplied into the OR processing section have magnitudes equal to each other, the OR processing section delivers the signal having a magnitude equal to those of the signals supplied thereto.

* * * * *